(12) United States Patent
Kaltalioglu et al.

(10) Patent No.: US 8,309,435 B2
(45) Date of Patent: Nov. 13, 2012

(54) CRACK STOPS FOR SEMICONDUCTOR DEVICES

(75) Inventors: Erdem Kaltalioglu, Newburgh, NY (US); Michael Beck, Dresden (DE)

(73) Assignee: Infineon Technologies AG, Neubiberg (DE)

(*) Notice: Subject to any disclaimer, the term of this patent is extended or adjusted under 35 U.S.C. 154(b) by 0 days.

(21) Appl. No.: 13/160,214

(22) Filed: Jun. 14, 2011

(65) Prior Publication Data

US 2011/0244658 A1   Oct. 6, 2011

Related U.S. Application Data

(62) Division of application No. 12/024,758, filed on Feb. 1, 2008, now Pat. No. 8,008,750.

(51) Int. Cl.
   *H01L 23/544* (2006.01)
(52) U.S. Cl. .......... 438/462; 257/E21.238; 257/620
(58) Field of Classification Search .......... 257/620; 438/462
   See application file for complete search history.

(56) References Cited

U.S. PATENT DOCUMENTS

| | | | |
|---|---|---|---|
| 5,834,829 | A | 11/1998 | Dinkel et al. |
| 6,022,791 | A | 2/2000 | Cook et al. |
| 6,163,065 | A | 12/2000 | Seshan et al. |
| 6,271,578 | B1 | 8/2001 | Mitwalsky et al. |
| 6,365,958 | B1 | 4/2002 | Ibnabdeljalil et al. |
| 6,495,918 | B1 | 12/2002 | Brintzinger |
| 6,841,455 | B2 | 1/2005 | West et al. |
| 7,235,864 | B2 | 6/2007 | Lee |
| 2005/0151239 | A1 | 7/2005 | Lee |
| 2005/0191845 | A1 | 9/2005 | Takada |
| 2006/0220250 | A1 | 10/2006 | Kim et al. |
| 2009/0166810 | A1 | 7/2009 | Stillman et al. |

*Primary Examiner* — Marcos D. Pizarro
*Assistant Examiner* — Eva Yan Montalvo
(74) *Attorney, Agent, or Firm* — Slater & Matsil, L.L.P.

(57) ABSTRACT

Crack stops for semiconductor devices, semiconductor devices, and methods of manufacturing semiconductor devices are disclosed. In one embodiment, a barrier structure for a semiconductor device includes a plurality of substantially V-shaped regions. Each of the plurality of substantially V-shaped regions is disposed adjacent another of the plurality of substantially V-shaped regions.

20 Claims, 6 Drawing Sheets

CRACK STOPS FOR SEMICONDUCTOR DEVICES

This application is a divisional of patent application Ser. No. 12/024,758, entitled "Crack Stops for Semiconductor Devices," filed on Feb. 1, 2008 now U.S. Pat. No. 8,008,750, which application is incorporated herein by reference.

TECHNICAL FIELD

The present invention relates generally to the fabrication of semiconductor devices, and more particularly to crack prevention structures.

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various layers using lithography to form circuit components and elements thereon.

Dozens or hundreds of integrated circuits are typically manufactured on a single semiconductor wafer. The individual die are singulated by sawing the integrated circuits along a scribe line. The individual die are then packaged, separately, in multi-chip modules, or in other types of packaging, for example.

When the die are singulated, packaged, or handled, material layers can crack proximate the scribe line, damaging the integrated circuits and leading to device failures. Crack prevention structures such as chip edge seal rings are often used near the edges of the die in an attempt to prevent cracking during singulation. However, conventional crack prevention structures often fail to prevent cracks in some applications, resulting in reduced yields.

Thus, what are needed in the art are methods and structures for preventing crack formation during the singulation, packaging, and handling processes of semiconductor devices.

SUMMARY OF THE INVENTION

These and other problems are generally solved or circumvented, and technical advantages are generally achieved, by preferred embodiments of the present invention, which provide novel barrier structures for crack prevention in semiconductor devices and manufacturing processes thereof.

In accordance with an embodiment of the present invention, a barrier structure for a semiconductor device includes a plurality of substantially V-shaped regions. Each of the plurality of substantially V-shaped regions is disposed adjacent another of the plurality of substantially V-shaped regions.

The foregoing has outlined rather broadly the features and technical advantages of embodiments of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Chip edge seal rings are often used near the edges of a die in an attempt to prevent cracking during singulation. However, conventional crack prevention structures often fail to prevent cracks in some applications. For example, one trend in advanced semiconductor devices is the use of low dielectric constant (k) materials for insulating materials, e.g., in metallization layers. Low k materials have a dielectric constant or k value of less than about 3.9, the k value of silicon dioxide. Low k materials have weak mechanical properties and are more likely to crack or delaminate during singulation, packaging, or handling than other insulating materials, for example. Thus, improved crack prevention structures are needed in the art.

The present invention will be described with respect to preferred embodiments in a specific context, namely, in barrier structures for preventing crack formation at the edges of semiconductor devices. Embodiments of the invention may also be applied, however, to other applications that would benefit from crack prevention barrier structures. The novel barrier structures may also be formed in other regions of integrated circuits other than at the edges of the die, for example.

Figure 1:
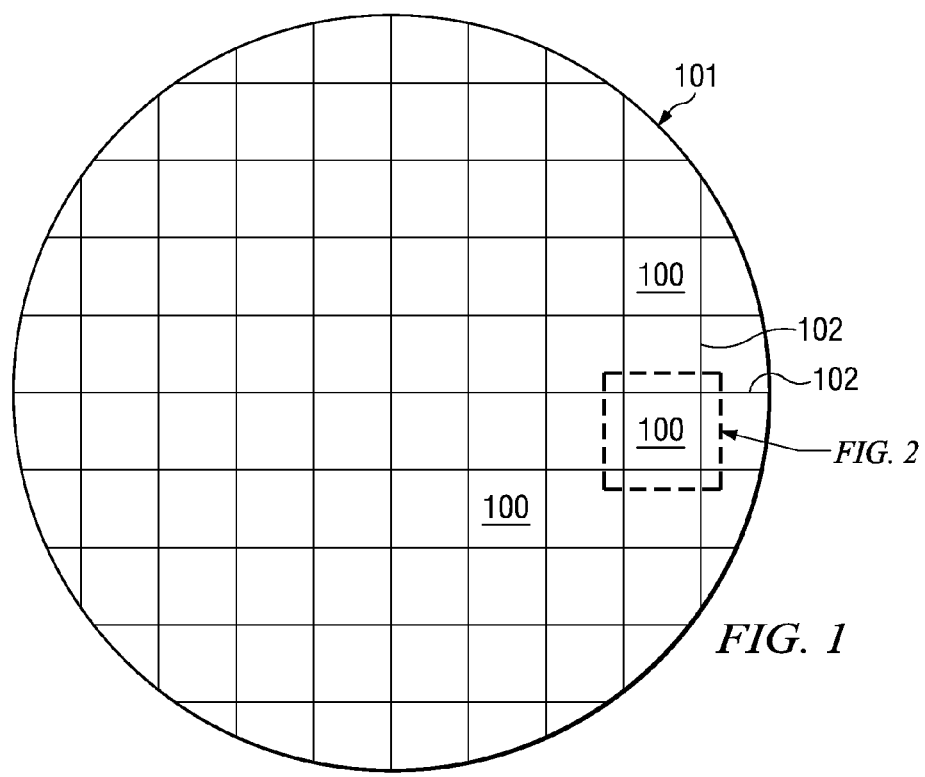
FIG. 1 is a top view of a semiconductor wafer comprising a plurality of die in accordance with an embodiment of the present invention.

With reference now to FIG. 1, there is shown a top view of a semiconductor wafer 101 comprising a plurality of die 100 in accordance with an embodiment of the present invention. The wafer 101 is generally round in a top view, and may include alignment features such as notches or straight edges, not shown. The wafer 101 includes a plurality of die 100 formed across a top surface. The die 100 may be square or rectangular in shape. Each die 100 comprises an integrated circuit and is also referred to herein as a semiconductor device or integrated circuit 100.

The plurality of die 100 is separated from other die 100 by scribe line regions 102 disposed between the die 100. The scribe line regions 102 are located at the perimeter of the die 100, e.g., in the kerf. At the end of the manufacturing process, a saw is used to singulate the die 100, detaching the die 100 from adjacent die 100. The saw cuts the wafer 101 at the scribe line regions 102. The singulation of the die 100 may also be performed by laser dicing or laser scribing, as examples.

Figure 2:
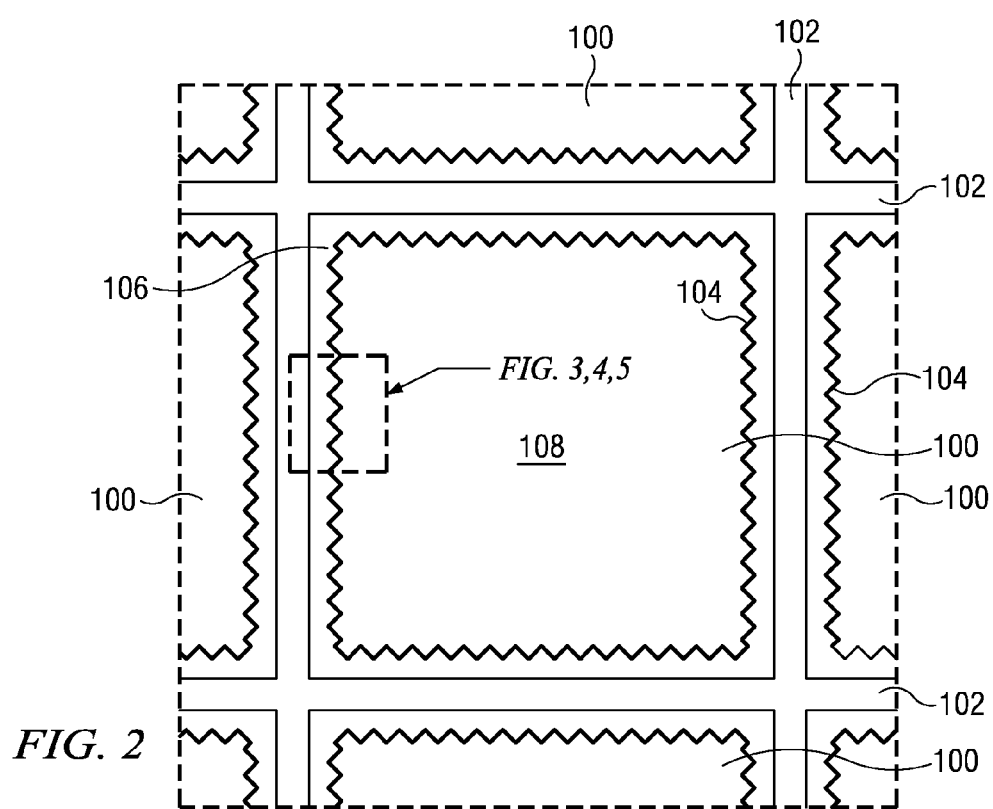
FIG. 2 is a more detailed view of a die of FIG. 1 that includes a novel crack prevention barrier structure comprising a plurality of substantially V-shaped regions in accordance with an embodiment of the present invention.

FIG. 2 is a more detailed view of a portion of the wafer 101 shown in FIG. 1, illustrating a top view of a die 100 of FIG. 1 that includes a novel crack prevention barrier structure 104 comprising a plurality of substantially V-shaped regions in accordance with an embodiment of the present invention. The scribe line regions 102 may comprise a width of about 40 to 180 µm, for example, although alternatively, the scribe line regions 102 may comprise other dimensions. The barrier structure 104 is formed in a perimeter region 106 of each die 100, as shown. The barrier structure 104 may comprise a width along the edge or perimeter region 106 of the die 100 of about 3 to 30 µm, for example, although alternatively, the barrier structure 104 may comprise other dimensions. The die 100 includes a central region 108 that comprises an active region, e.g., containing functioning circuitry for the integrated circuit or semiconductor device 100.

Figure 3:
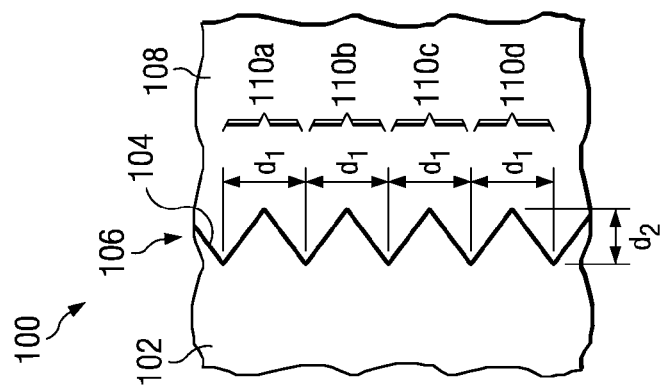
FIG. 3 shows a more detailed view of a barrier structure in accordance with an embodiment of the present invention, wherein the plurality of substantially V-shaped regions comprise substantially the same size and shape.

FIG. 3 shows a more detailed view of the barrier structure 104 in accordance with an embodiment of the present invention, wherein the plurality of substantially V-shaped regions 110a, 110b, 110c, and 110d of the barrier structure 104 comprise substantially the same size and shape. The barrier structure 104 comprises a single continuous line of the plurality of substantially V-shaped regions 110a, 110b, 110c, and 110d in the embodiment shown in FIG. 3. The single continuous line preferably extends along an entire perimeter region 106 of a semiconductor device 100, e.g., between the central region 108 and the scribe line region 102.

Each substantially V-shaped region 110a, 110b, 110c, and 110d comprises a width comprising a dimension $d_1$ and a height comprising a dimension $d_2$. The terms height and width are used herein to refer to a substantial V shape of substantially V-shaped regions 110a, 110b, 110c, and 110d with the opening of the V facing upward, for example, wherein the height is the measurement from the lower pointed area to top of the V, and wherein the width is the measurement across the top of the V. Dimensions $d_1$ and $d_2$ are substantially the same for each substantially V-shaped region 110a, 110b, 110c, and 110d in the embodiment shown in FIG. 3, for example. Dimensions $d_1$ and $d_2$ may comprise about 50 nm to several µm, for example, although alternatively, dimensions $d_1$ and $d_2$ may comprise other values.

Figure 4:
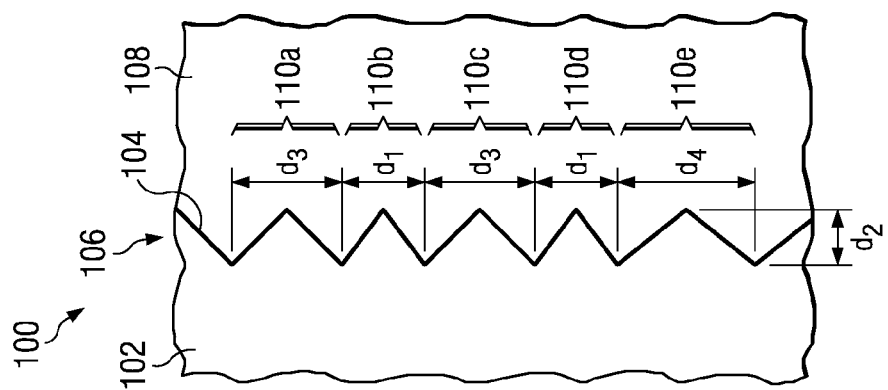
FIGS. 4 and 5 illustrate embodiments of the present invention wherein the plurality of substantially V-shaped regions of barrier structures comprise different sizes or shapes.
Figure 5:
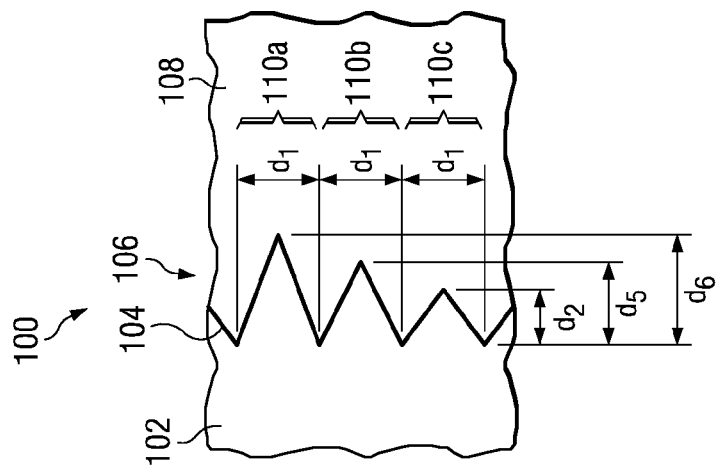

FIGS. 4 and 5 illustrate embodiments of the present invention wherein the plurality of substantially V-shaped regions of the barrier structures 104 comprise different sizes or shapes. In FIG. 4, the height comprising dimension $d_2$ is substantially the same for each substantially V-shaped region 110a, 110b, 110c, 110d, and 110e. However, the widths $d_1$, $d_3$, and $d_4$ of substantially V-shaped regions 110a, 110b, 110c, 110d, and 110e may vary. For example, substantially V-shaped region 110e comprises a width comprising dimension $d_4$; substantially V-shaped regions 110a and 110c comprise a width comprising dimension $d_3$ that is less than dimension $d_4$; and substantially V-shaped regions 110b and 110d comprise a width comprising dimension $d_1$ that is less than dimensions $d_4$ and $d_3$. Dimensions $d_1$, $d_2$, $d_3$, and $d_4$ may comprise about 50 nm to several µm, for example, although alternatively, dimensions $d_1$, $d_2$, $d_3$, and $d_4$ may comprise other values. The height that is shown in FIG. 4 comprising dimension $d_2$ may also vary for the substantially V-shaped regions 110a, 110b, 110c, 110d, and 110e in some embodiments, for example.

In FIG. 5, the width comprising dimension $d_1$ is substantially the same for each substantially V-shaped region 110a, 110b, and 110c. However, the heights $d_2$, $d_5$, and $d_6$ of substantially V-shaped regions 110a, 110b, and 110c may vary. For example, substantially V-shaped region 110c comprises a height comprising dimension $d_2$; substantially V-shaped region 110b comprises a height comprising a dimension $d_5$ that is greater than dimension $d_2$; and substantially V-shaped region 110a comprises a height comprising dimension $d_6$ that is greater than dimensions $d_2$ and $d_5$. Dimensions $d_1$, $d_2$, $d_5$, and $d_6$ may comprise about 50 nm to several µm, for example, although alternatively, dimensions $d_1$, $d_2$, $d_5$, and $d_6$ may comprise other values. The width that is shown in FIG. 5 comprising dimension $d_1$ may also vary for the substantially V-shaped regions 110a, 110b, and 110c in some embodiments, for example.

Figure 6:
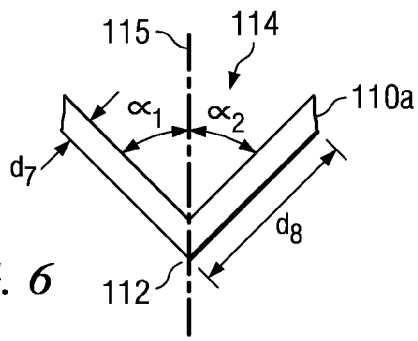
FIG. 6 shows a more detailed view of a substantially V-shaped region of the barrier structure, wherein the substantially V-shaped region may be asymmetric or symmetric about a central axis.

FIG. 6 shows a more detailed view of a substantially V-shaped region 110a of a portion of a barrier structure 104 of embodiments of the present invention, wherein the substantially V-shaped region 110a may be asymmetric or symmetric about a central axis 115. The substantially V-shaped region 110a of the barrier structure 104 comprises a pointed area 112 and an open area 114. The central axis 115 extends from the pointed area 112 towards and into the open area 114 of the substantially V-shaped region 110a, as shown. The central axis 115 may extend from the pointed area 112 into the open area 114 of the substantially V-shaped region 110a at about ninety degrees from an edge of the die 100 (e.g., proximate the scribe line region 102) into the central region 108 of the die 100, for example.

One side of the substantially V-shaped region 110a extends outwardly from the central axis 115 by an angle $\alpha_1$, e.g., to the left in FIG. 6. The other side of the substantially V-shaped region 110a extends outwardly from the central axis 115 by an angle $\alpha_2$, e.g., to the right in FIG. 6. Angles $\alpha_1$ and $\alpha_2$ may be the same; e.g., the substantially V-shaped region 110a may be symmetric about the central axis 115. Alternatively, angles $\alpha_1$ and $\alpha_2$ may be different; e.g., the substantially V-shaped region 110a may be asymmetric about the central axis 115, in accordance with embodiments of the present invention. Angles $\alpha_1$ and $\alpha_2$ may range from greater than about zero to less than about 90 degrees, for example, although alternatively, angles $\alpha_1$ and $\alpha_2$ may also be greater than 90 degrees in some embodiments. The total or sum of angles $\alpha_1$ and $\alpha_2$ may be about 180 degrees or less in some embodiments of the present invention, for example.

The substantially V-shaped regions 110a of the barrier structure 104 may comprise a thickness or dimension $d_7$ of about 50 nm to several μm, for example, although alternatively, dimension $d_7$ may comprise other values. The length of the sides or dimension $d_8$ of the substantially V-shaped regions 110a may comprise about 100 nm to several μm, for example, although alternatively, dimension $d_8$ may comprise other values.

In accordance with embodiments of the present invention, the pointed area 112 of the substantially V-shaped regions 110a is positioned towards a central region 108 of an integrated circuit 100, and the open area 114 is positioned towards a scribe line region 102 of a wafer 101. The open area 114 functions to prevent or stop cracks that may form during singulation, packaging, and/or handling of the semiconductor device 100 from perpetuating or enlarging, e.g., preventing cracks from reaching the active areas in the central region 108 of the semiconductor device or die 100.

Figure 7:
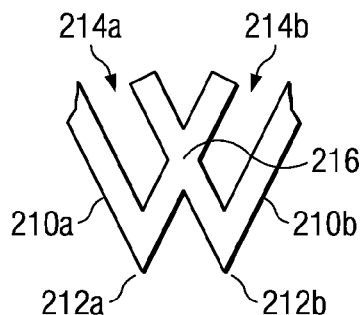
FIG. 7 shows an embodiment wherein two of the substantially V-shaped regions of the barrier structure intersect or are interlocked.

FIG. 7 shows an embodiment of the present invention wherein two of the substantially V-shaped regions 210a and 210b of the barrier structure 206 intersect. Like numerals are used for the various materials and elements that were used to describe FIGS. 1 through 6. To avoid repetition, each reference number shown in FIG. 7 is not described again in detail herein. Rather, similar materials and elements are preferably used for the various materials and elements x02, x04, x06, x08, etc. . . . shown as were used to describe FIGS. 1 through 6, where x=1 in FIGS. 1 through 6 and x=2 in FIG. 7.

FIG. 7 shows a portion of a barrier structure 204 wherein two substantially V-shaped regions 210a and 210b intersect or are interlocked, e.g., in an intersect region 216. A portion of the two substantially V-shaped regions 210a and 210b may comprise a shape of an X (e.g., in a region proximate the intersect region 216) and/or the shape of a W, as shown. A smaller V shape is formed between the open areas 214a and 214b within the W shape proximate the intersect region 216, which advantageously provides a further crack prevention portion of the novel barrier structure 204.

Figure 8:
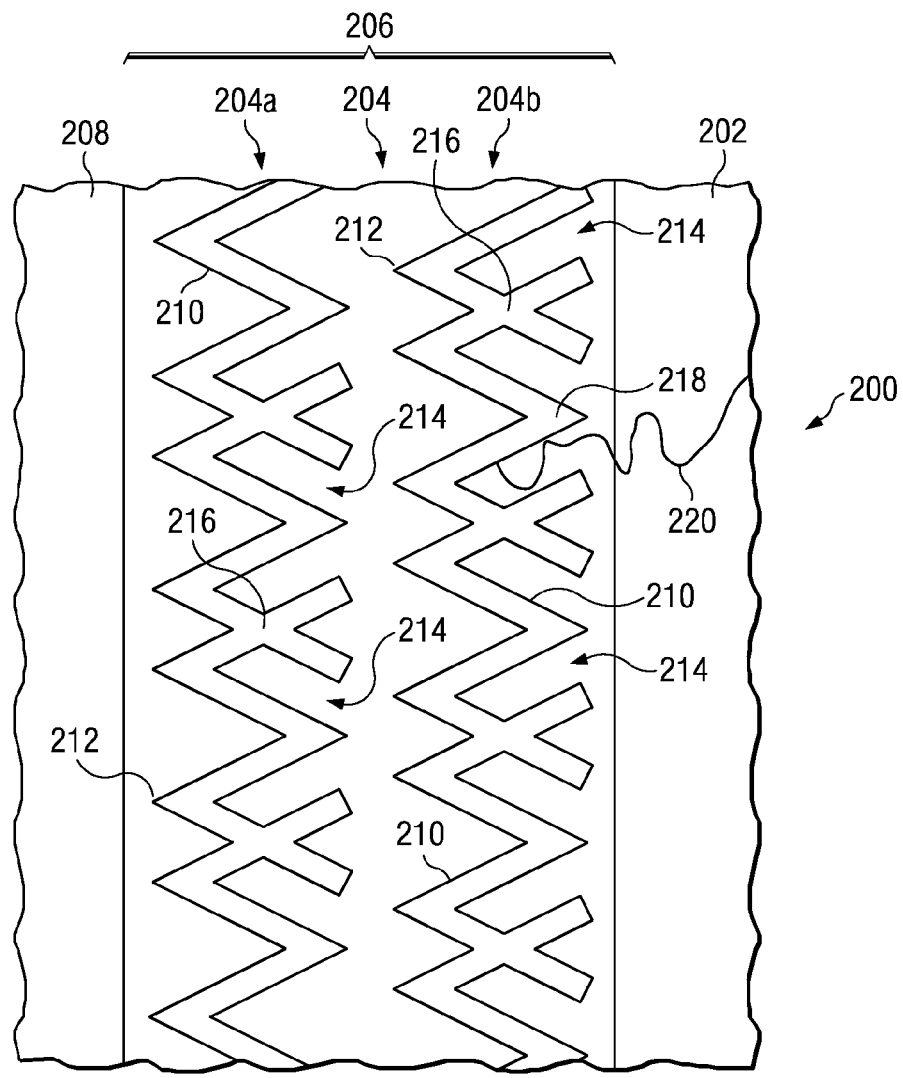
FIG. 8 shows an embodiment of the present invention wherein the plurality of substantially V-shaped regions are arranged in two continuous lines in a perimeter region of the integrated circuit, and wherein some of the substantially V-shaped regions intersect.

FIG. 8 shows an embodiment of the present invention wherein the barrier structure 204 comprises a plurality of substantially V-shaped regions 210 arranged in two parallel continuous lines 204a and 204b in a perimeter region 206 of the integrated circuit 200, and wherein some of the substantially V-shaped regions 210 intersect at regions 216. Some of the plurality of substantially V-shaped regions 210 are coupled to an adjacent substantially V-shaped region 210 at the ends, e.g., at the tips 218 of the substantially V-shaped regions 210.

The open areas 214 of the substantially V-shaped regions 210 are advantageously positioned to face towards the scribe line region 202 to stop cracks such as crack 220 that may form during singulation. The pointed areas 212 are positioned to face towards the central region 208 of the integrated circuit 200.

Advantageously, in the embodiment shown in FIG. 8, the barrier structure 204 comprises two continuous lines 204a and 204b comprised of a plurality of substantially V-shaped regions 210. The two continuous lines 204a and 204b extend and are substantially parallel to one another along the perimeter region 206 of the semiconductor device 200, proximate one another. A barrier structure 204 comprising two continuous lines 204a and 204b provides redundancy in the barrier structure 204. For example, if the line 204b fails to prevent the crack 220 from moving into the region between the two lines 204a and 204b, line 204a is present and is adapted to stop the crack 220 from moving further into the central region 208 of the die 220 containing the active circuitry.

Note that the barrier structures 104 shown in FIGS. 3 through 5 may also include two continuous parallel lines of substantially V-shaped regions 110a, 110b, 110c, 110d, and 110e formed proximate the scribe line regions 102, for example, to provide redundancy in the crack prevention barrier structure 104 and to provide increased structural strength for the barrier structures 104, not shown in the drawings.

Figure 9:
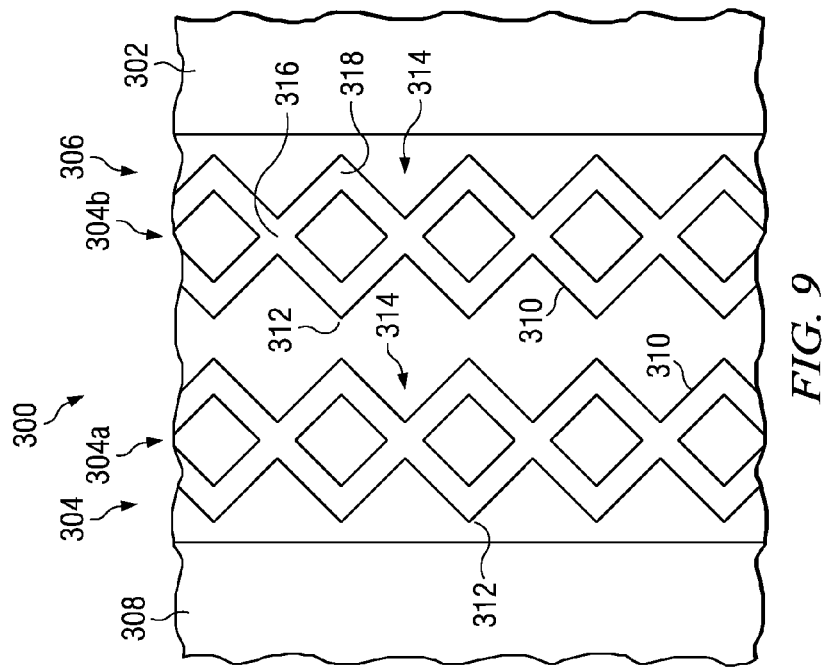
FIG. 9 illustrates another embodiment of the present invention, wherein the substantially V-shaped regions intersect to form a plurality of substantially X-shaped structures.

FIG. 9 illustrates another embodiment of the present invention, wherein the substantially V-shaped regions 310 of the barrier structure 304 intersect at intersect regions 316 to form a plurality of shapes comprising substantially a shape of an X. Again, like numerals are used for the various elements that were used to describe the previous figures, and to avoid repetition, each reference number shown in FIG. 9 (and also subsequent FIGS. 10 through 15) is not described again in detail herein. The intersect regions 316 may be formed proximate a substantially central region of the side of each substantially V-shaped region, for example. The barrier structure 304 may comprise two continuous lines 304a and 304b that extend along the perimeter (e.g., in perimeter region 306) and sides (e.g., along all edges) of the integrated circuit 300 in a top view. The continuous lines 304a and 304b of the barrier structure 304 comprise a lattice shape comprising a plurality of substantially X shaped structures, for example.

Each of the continuous lines 304a and 304b may comprise two sets of substantially V-shaped structures, with one set of substantially V-shaped regions 310 being coupled together at the ends, e.g., at the tips of the V, in intersection regions 318 at ends of the V shapes. Another set of substantially V-shaped regions 310 is disposed in a mirror image to and intersecting with the other set of substantially V-shaped regions 310, e.g., at intersect regions 316, as shown. The intersect regions 316 may be formed proximate a substantially central region of each side of the substantially V-shaped regions within the sets of substantially V-shaped regions 310, for example.

Figure 12:
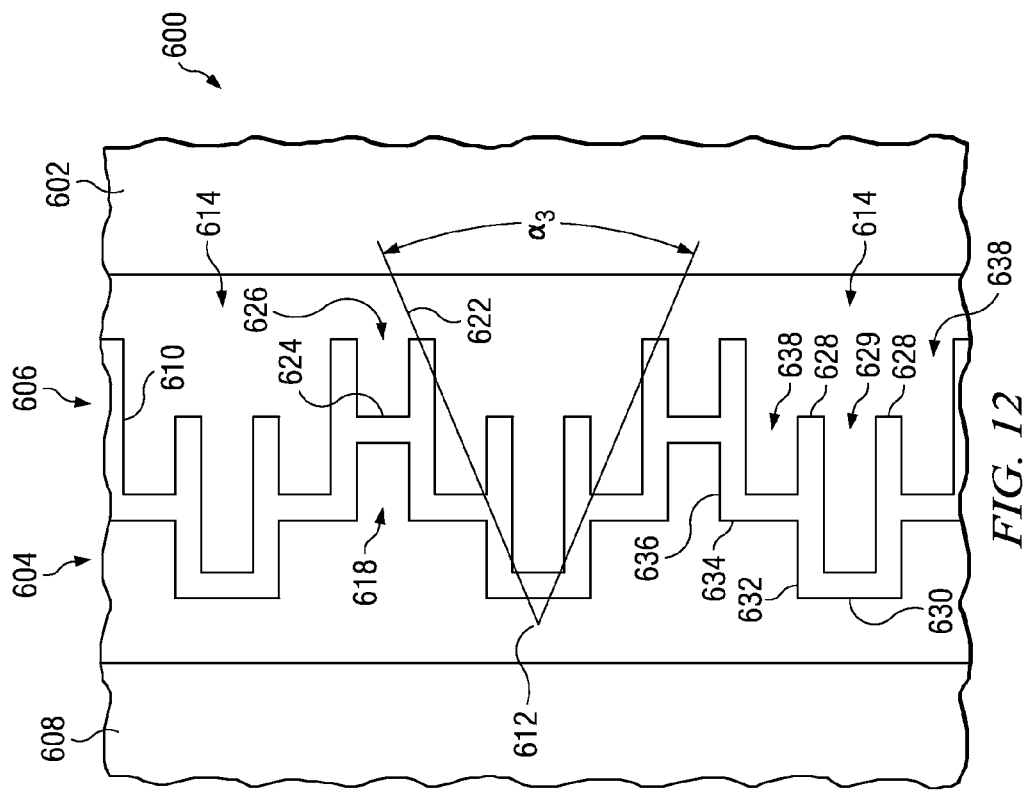
FIG. 12 shows an embodiment wherein the substantially V-shaped regions include a protruding element within an open area of the substantially V-shaped regions and a connecting member disposed between the substantially V-shaped regions.

In the embodiments shown in FIGS. 2 through 9, substantially V-shaped regions 110a, 110b, 110c, 110d, 110e, 210, 210a, 210b, and 310 are shown that have a V shape, wherein the sides comprise two substantially straight lines that intersect at a pointed area 112, 212, and 312. In other embodiments of the present invention, the sides of the substantially V-shaped regions 410 may not be completely or substantially straight, as shown in FIGS. 10, 11, and 12.

Figure 10:
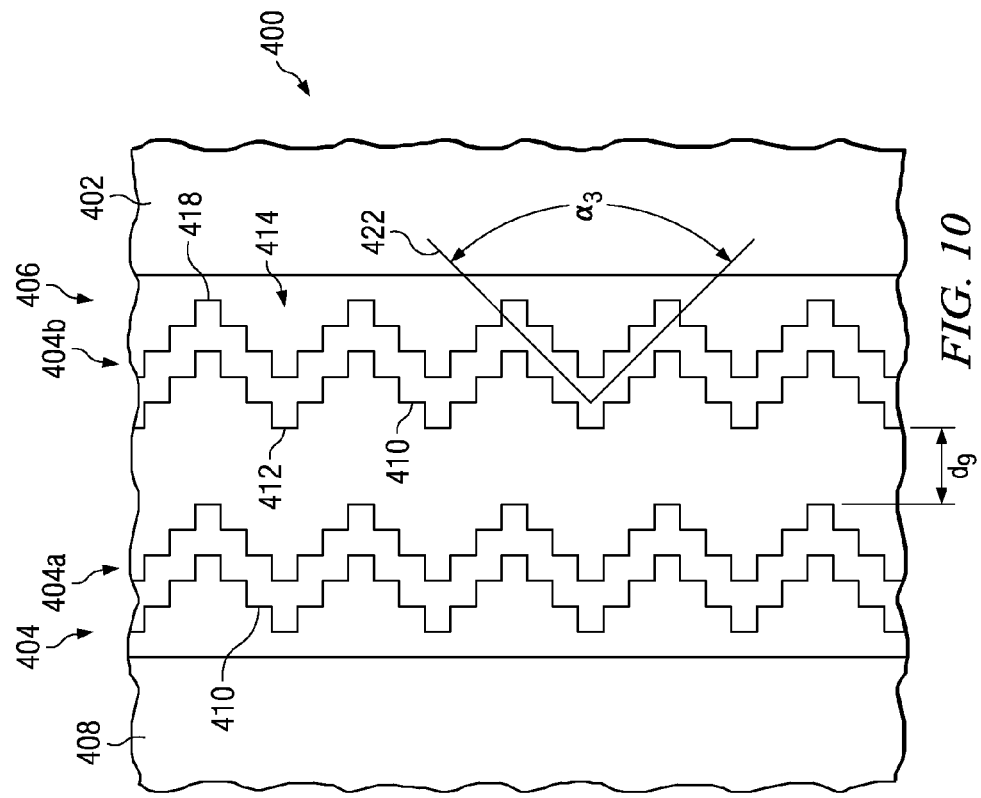
FIG. 10 shows yet another embodiment of the present invention, wherein the substantially V-shaped regions of the barrier structure comprise two stair-step-shaped elements that intersect at a substantially pointed area.

For example, FIG. 10 shows yet another embodiment of the present invention, wherein the substantially V-shaped regions 410 of the barrier structure 404 comprise two stair-step-shaped elements that intersect at a substantially pointed area 412. The sides of the substantially V-shaped regions 410 comprise the stair-step-shaped elements, for example. The two stair-step-shaped elements extending from the substantially pointed area 412 form a substantial V shape, as shown at 422. Adjacent stair-step-shaped elements may be coupled together at the tips 418 of the substantially V-shaped regions 410. The substantially V-shaped regions 410 may comprise an open area 414 having an angle $\alpha_3$ between the two sides of about 180 degrees or less, for example. In the embodiment shown in FIG. 10, angle $\alpha_3$ comprises about 80 to 90 degrees, for example.

In embodiments wherein the barrier structure 404 comprises two continuous lines 404a and 404b of substantially V-shaped structures, the two continuous lines 404a and 404b may be spaced apart by a dimension or distance $d_9$, as shown in FIG. 10. Dimension $d_9$ may comprise about 50 nm to several μm, for example.

Figure 11:
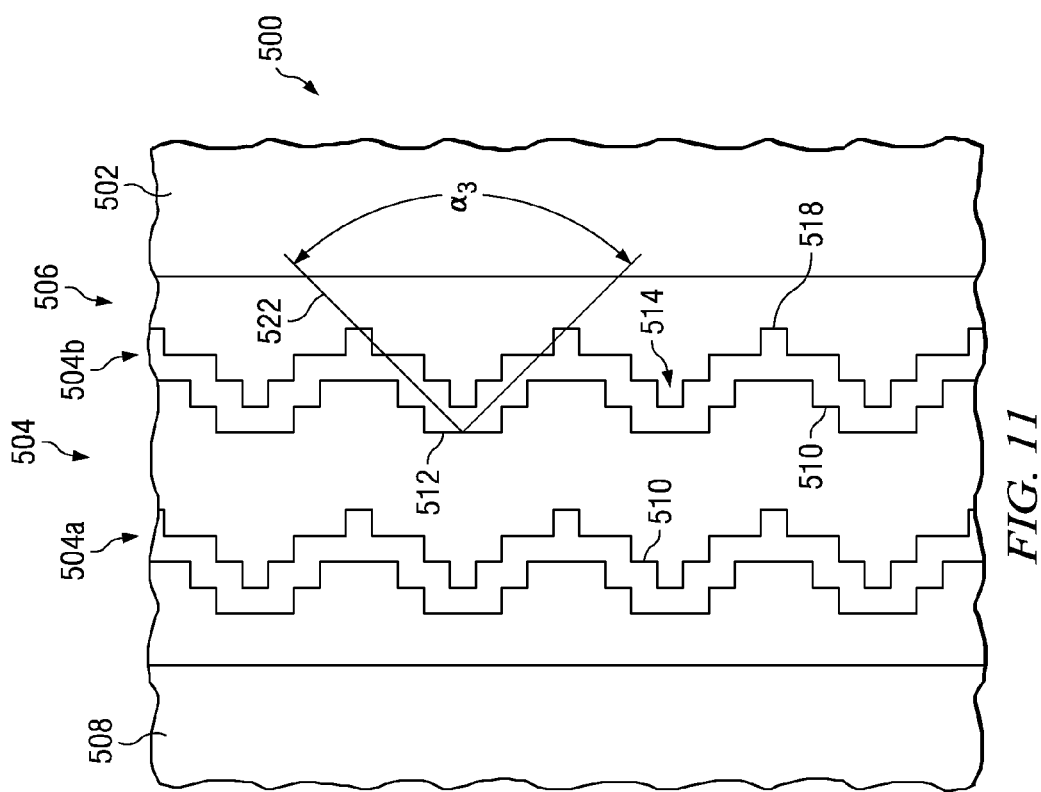
FIG. 11 shows an embodiment similar to the embodiment shown in FIG. 10 comprising substantially V-shaped regions wherein the V openings comprise a larger angle.

FIG. 11 shows an embodiment of the present invention similar to the embodiment shown in FIG. 10, wherein the sides of the substantially V-shaped regions 510 of the barrier structure 504 comprise stair-step-shaped elements that intersect at a substantially pointed area 512. In this embodiment, the angle $\alpha_3$ of the substantial V shape shown at 522 comprises about 100 to 110 degrees, as another example. Alternatively, angle $\alpha_3$ may comprise other dimensions.

The barrier structures 304, 404, and 504 of the embodiments shown in FIGS. 9, 10, and 11 may also comprise a single continuous line 304a, 404a, or 504a or 304b, 404b, or 504b rather than a dual line 304a and 304b, 404a and 404b, or 504a and 504b structure shown in FIGS. 9, 10, and 11, respectively, for example.

FIG. 12 shows an embodiment of the present invention wherein the substantially V-shaped regions 610 of the barrier structure 604 include two protruding elements 628 extending from the sides into the open area 614 of the substantially V-shaped regions 610 and a connecting member 624 disposed between the substantially V-shaped regions 610. The substantial V shape of the substantially V-shaped regions 610 is shown at 622, for example. The sides of the substantial V shapes of the substantially V-shaped regions 610 comprise stair-step-shaped elements 630, 632, 634, and 636 that are interconnected in a staggered stair-step shape.

The protruding elements 628 are coupled to and extend from one of the stair-shape-shaped elements, e.g., from stair-shaped elements 632 and/or 634 as shown in FIG. 12. The protruding elements 628 are disposed in and extend into the open areas 614 of the substantially V-shaped regions 610.

Only four stair-step-shaped elements 630, 632, 634, and 636 are shown in the embodiment illustrated in FIG. 12; alternatively, the sides of the substantially V-shaped regions 610 may comprise smaller or larger numbers of stair-step-shaped elements, for example. The sides of the substantially V-shaped regions 410 shown in FIG. 10 comprise seven stair-step-shaped elements, and sides of the substantially V-shaped regions 510 shown in FIG. 11 comprise six stair-step-shaped elements, as examples. The greater the number of stair-step-shaped elements within the V-shaped regions 610, the more the substantially V-shaped regions 610 resemble the shape of a V, for example.

Advantageously, in this embodiment, the protruding elements 628 segment the opening 614, providing an additional barrier for cracks that may form. For example, an opening 629 is formed between the two protruding elements 628. Openings 638 are formed within the stair-shaped elements 634 and 636 and the protruding elements 628, for example. Thus, the openings 614 are segmented into three openings by the protruding elements 628: one central opening 629 and two openings 638 on either side of the central opening 629.

Furthermore, the connecting member 624 used to connect the adjacent substantially V-shaped regions 610 creates an opening 626 between the connecting member 624 and two adjacent stair-step elements 636, providing an additional barrier for cracks that may form, for example.

The barrier structure 604 shown in FIG. 12 may also include two continuous parallel lines of the substantially V-shaped structures 610, as described with reference to the embodiments shown in FIGS. 8 through 11, for redundancy and increased structural strength. The protruding elements 628 preferably are formed extending into the V opening 614 towards the scribe line region 602 of the semiconductor device 600, as shown.

The novel substantially V-shaped structures 110a, 110b, 110c, 110d, 110e, 210, 210a, 210b, 310, 410, 510, and 610 are preferably formed in at least one via layer of a semiconductor device. In other embodiments, the novel substantially V-shaped barrier structures 110a, 110b, 110c, 110d, 110e, 210, 210a, 210b, 310, 410, 510, and 610 may be formed in at least one via layer and at least one conductive line layer, for example. Furthermore, in other embodiments, the novel substantially V-shaped barrier structures 110a, 110b, 110c, 110d, 110e, 210, 210a, 210b, 310, 410, 510, and 610 of the barrier structures 104, 204, 304, 404, 504, and 604 may be formed in at least one via layer and at least one conductive line layer below and above the via layer, for example.

Figure 13:
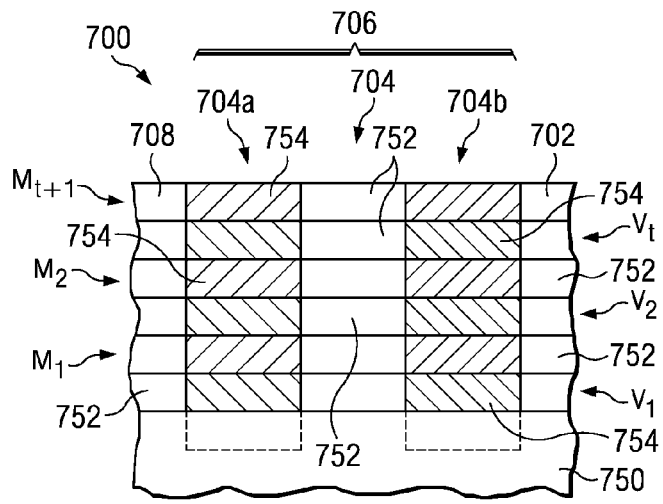
FIG. 13 is a cross-sectional view of a semiconductor device, illustrating the novel barrier structure described herein formed in a plurality of metallization layers.
Figure 14:
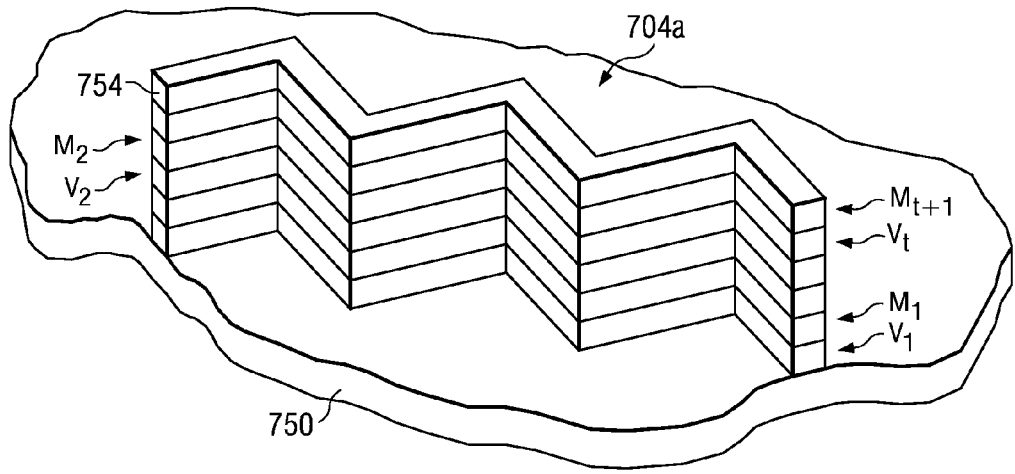
FIG. 14 shows a perspective view of the barrier structure shown in FIG. 13.

FIG. 13 is a cross-sectional view of a semiconductor device 700, illustrating the novel barrier structure 704 described herein formed in a plurality of metallization layers $V_1$, $M_1$, $V_2$, $M_2$ ... $V_t$ and $M_{t+1}$. FIG. 14 shows a perspective view of a portion 704a of the barrier structure 704 shown in FIG. 13.

The metallization layers comprise conductive line layers $M_1$, $M_2$ through $M_{t+1}$ and via layers $V_1$, $V_2$ through $V_t$ disposed between the conductive line layers $M_1$, $M_2$ through $M_{t+1}$. Conductive lines and vias that provide interconnect for the semiconductor device 700 may be formed in the conductive line layers $M_1$, $M_2$ through $M_{t+1}$ and via layers $V_1$, $V_2$ through $V_t$ elsewhere on the semiconductor device 700, for example, not shown. The novel barrier structure 704 is formed within the metallization layers $V_1$, $M_1$, $V_2$, $M_2$ through $V_t$ and $M_{t+1}$ and may be formed using the same lithography mask and lithography processes used to form the conductive lines and vias for the semiconductor device 700, for example. Thus, no additional lithography masks or lithography steps are required to manufacture some embodiments of the present invention, advantageously. The pattern for the barrier structures 704 may be included in existing mask sets for the semiconductor device 700, for example.

Figure 15:
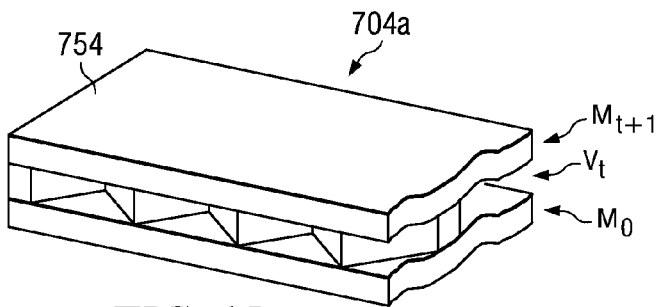
FIG. 15 shows a perspective view of another embodiment of the present invention wherein the barrier structure comprises plate-like structures in conductive line layers.

The barrier structure 704 advantageously may comprise via bars that comprise the same shape in at least the via layers $V_1$, $V_2$ through $V_t$, and optionally also in each of the conductive line layers $M_1$, $M_2$ through $M_{t+1}$ and as shown. The barrier structures 704 may comprise the same shape within each material layer $M_1$, $M_2$ through $M_{t+1}$, and $V_1$, $V_2$ through $V_t$, superimposed over or overlaid over one another, as shown. Alternatively, the barrier structures 704 may be wider in a lateral direction in the conductive line layers $M_1$, $M_2$ through $M_{t+1}$, as shown in FIG. 15. The barrier structure 704 may be formed using damascene processes, dual damascene processes, multiple damascene processes, subtractive etch processes, or combinations thereof, as examples.

For example, referring again to FIG. 13, in a single damascene process, after active areas such as transistors, memory devices, and isolation regions (not shown) are formed in the workpiece 750, a dielectric material 752 may be deposited over the workpiece 750. The dielectric material 752 may comprise silicon dioxide, silicon nitride, silicon oxynitride, low k materials, high k materials having a dielectric constant or k value of greater than about 3.9, multiple layers, liners, and/or combinations thereof, as examples, although other materials may also be used. The dielectric material 752 may be patterned for the pattern for the barrier structure 704 portion for that particular material layer (e.g., such as via layer $V_1$). The dielectric material 752 is patterned using lithography (e.g., using energy and a lithography mask to pattern a photosensitive material deposited over the dielectric material 752), forming spaces in the dielectric material 752.

A conductive material 754 is deposited over the patterned dielectric material 752 to fill the spaces in the dielectric material 752. The conductive material 754 may comprise copper, aluminum, other metals, and one or more liners or barrier layers, as examples. Excess portions of the conductive material 754 are removed from over the top surface of the dielectric material 752, using an etch process and/or chemical-mechanical polishing (CMP) process, for example. Several single damascene processes may be repeated to form the other metallization layers $V_2$, $M_2$, $V_t$ and $M_{t+1}$, for example.

In a dual damascene technique, two metallization layers are formed at once, by patterning two insulating material layers 752 using two lithography masks and processes, and then filling the patterns within the insulating material 752 with a conductive material. The dual damascene processes may be via-first, wherein a via level such as $V_1$ is patterned before a conductive line layer such as $M_1$ is patterned, or via-last, wherein a conductive line layer such as $M_1$ is patterned before a via level such as $V_1$ is patterned, as examples. An adjacent conductive line layer such as $M_1$ and via level such as $V_1$ may be formed within a single insulating material layer 752 simultaneously with a single fill process using a dual damascene process, for example.

Alternatively, the barrier structure 704 may be formed using subtractive etch processes, e.g., by depositing a conductive material 754 over the workpiece 750, and removing portions of the conductive material 754, leaving the desired patterned conductive material 754 formed over the workpiece 750, forming the barrier structure 704 within the desired metallization layers $V_1$, $M_1$, $V_2$, $M_2$ through $V_t$ and $M_{t+1}$. An insulating material 752 is then formed over the conductive material 754, e.g., between the patterned conductive material 754.

In accordance with some embodiments of the present invention, the barrier structure 704 is preferably formed in every metallization layer $V_1$, $M_1$, $V_2$, $M_2$ through $V_t$ and $M_{t+1}$ of the semiconductor device 700. The barrier structure 704 preferably comprises a wall of metallization formed from interlocked or intersecting substantially V-shaped structures 710 disposed at the periphery of the die, as shown in a perspective view in FIG. 14. Alternatively, in other embodiments, the barrier structure 704 may be formed in one or more metallization layers $V_1$, $M_1$, $V_2$, $M_2$ through $V_t$ and $M_{t+1}$ of the semiconductor device 700, for example.

Note that three conductive line layers $M_1$, $M_2$ through $M_{t+1}$ and via layers $V_1$, $V_2$ through $V_t$ are shown in FIGS. 13 and 14; alternatively, the semiconductor device 700 may comprise only one conductive line layer $M_1$, fewer than three conductive line layers $M_1$, $M_2$ through $M_{t+1}$ and via layers $V_1$, $V_2$ through $V_t$, or four or more conductive line layers $M_1$, $M_2$ through $M_{t+1}$ and via layers $V_1$, $V_2$ through $V_t$, for example, not shown.

FIG. 15 shows a perspective view of another embodiment of the present invention wherein the barrier structure 704a comprises plate-like structures in conductive line layers $M_1$ through $M_{t+1}$. In some embodiments, the barrier structure 704a within the conductive line layers may be substantially V-shaped and may comprise substantially V-shaped structures that are larger than the substantially V-shaped structures formed within the via layers $V_1$ through $V_t$. In other embodiments, the barrier structure 704a formed within the conductive line layers $M_0$ through $M_{t+1}$ are not substantially V-shaped, but rather, the barrier structure 704a formed within the conductive line layers $M_0$ through $M_{t+1}$ comprises plate-like structures covering the substantial V-shapes formed in the via levels $V_t$ at the top and bottom of the substantial V-shaped structures in the via levels $V_t$. In these embodiments, the larger portions of the barrier structure 704a in the conductive line layers $M_0$ through $M_{t+1}$ adjacent the substantial V-shaped structures in the via levels $V_t$ advantageously assist in trapping potential cracks that may form within a single via level $V_t$. Cracks may advantageously be retained within a single via layer or level $V_t$, because the cracks are prevented from perpetuating laterally and also vertically, e.g., in an upward or downward direction along the barrier structure 704a wall by the oversized portions of the barrier structure 704a in the conductive line layers $M_0$ through $M_{t+1}$, for example, in these embodiments.

In some embodiments of the present invention, the barrier structures 104, 204, 304, 404, 504, 604, and 704 are formed during the formation of metallization layers such as conductive line layers $M_1$, $M_2$, and $M_{t+1}$ and via layers $V_1$, $V_2$, and $V_t$ shown in FIGS. 13 and 14. Alternatively, the barrier structures 104, 204, 304, 404, 504, 604, and 704 described herein may be formed after fabrication of the other material layers of the integrated circuits 100, 200, 300, 400, 500, 600, and 700. For example, referring again to FIG. 13, after the fabrication process for the metallization layers $V_1$, $M_1$, $V_2$, $M_2$, $V_t$, and $M_{t+1}$ of the semiconductor device 700, the insulating material layers 752 may be patterned with trenches comprising a plurality of V-shaped regions in a top view of the semiconductor device 700. A top portion of the workpiece 750 may also be patterned during the patterning process of the insulating material layers 752, as shown in phantom. The trenches within the insulating material layers 752 are then filled with a conductive material 754, for example, and excess portions of the conductive material 754 may then be removed from the top surface of the top-most insulating material layer 752, for example. The barrier structure 700 may extend into a top portion of the workpiece 750 in this embodiment, as shown in phantom. The barrier structures 700 may optionally extend into a top portion of the workpiece 750 by a few nm or greater, for example.

Embodiments of the present invention include barrier structures 104, 204, 304, 404, 504, 604, and 704 for integrated circuits, semiconductor devices 100, 200, 300, 400, 500, 600, and 700 comprising the novel barrier structures 104, 204, 304, 404, 504, 604, and 704, and methods of manufacturing semiconductor devices 100, 200, 300, 400, 500, 600, and 700 including the barrier structures 104, 204, 304, 404, 504, 604, and 704 described herein.

The barrier structures 104, 204, 304, 404, 504, 604, and 704 are shown and described herein as being formed at perimeter regions 106, 206, 306, 406, 506, 606, and 706 of the semiconductor devices 100, 200, 300, 400, 500, 600, and 700, e.g., proximate the scribe line regions 102, 202, 302, 402, 502, and 602. Alternatively, the barrier structures 104, 204, 304, 404, 504, 604, and 704 described herein may also be formed in central regions 108, 208, 308, 408, 508, and 608 of semiconductor devices 100, 200, 300, 400, 500, 600, and 700 in some applications, for example.

Advantages of embodiments of the invention include providing novel barrier structures 104, 204, 304, 404, 504, 604, and 704 that prevent cracking of integrated circuits or semiconductor devices 100, 200, 300, 400, 500, 600, and 700 during singulation processes, packaging processes, or handling, e.g., when the novel barrier structures 104, 204, 304, 404, 504, 604, and 704 are placed in perimeter regions 106, 206, 306, 406, 506, 606, and 706 proximate the scribe line regions 102, 202, 302, 402, 502, and 602. The novel substantially V-shaped regions of the barrier structures 104, 204, 304, 404, 504, 604, and 704 provide a larger surface for crack prevention. The substantially V-shaped regions 110a, 110b, 110c, 110d, 110e, 210, 210a, 210b, 310, 410, 510, 610, and 710a of the barrier structures 104, 204, 304, 404, 504, 604, and 704 trap cracks as they form and prevent them from becoming larger or perpetuating, protecting the active areas and functioning circuitry of the integrated circuits in central regions 108, 208, 308, 408, 508, and 608 of semiconductor devices 100, 200, 300, 400, 500, 600, and 700.

The novel barrier structures 104, 204, 304, 404, 504, 604, and 704 described herein comprise novel crack-stop designs having increased crack trapping properties. The barrier structures 104, 204, 304, 404, 504, 604, and 704 have superior mechanical strength in stopping chip cracks. In some embodiments, the barrier structures 104, 204, 304, 404, 504, 604, and 704 comprise continuous via bars to absorb a maximum level of energy from cracks and hold the crack within crack-stopping barrier structures 104, 204, 304, 404, 504, 604, and 704.

The novel crack-trapping crack stop or barrier structures 104, 204, 304, 404, 504, 604, and 704 have interlocked substantially V shaped via bars, with the open ends 114, 214, 314, 414, 514, and 614 of the substantially V-shaped regions 110a, 110b, 110c, 110d, 110e, 210, 210a, 210b, 310, 410, 510, 610, and 710a facing towards a chip edge in at least one via layer $V_1$, $V_2$, or $V_t$ of a semiconductor device 100, 200, 300, 400, 500, or 600, to trap any incoming cracks that may form. The barrier structures 104, 204, 304, 404, 504, 604, and 704 seal the chip interior from the chip edge after dicing against moisture or/and to stop chip cracks from penetrating into the central region 108, 208, 308, 408, 508, 608 of the chip.

If a semiconductor device 100, 200, 300, 400, 500, 600, or 700 has metallization layers $M_0$ through $M_{t+1}$ and $V_0$ through $V_t$ that have low k or ultra low k insulating materials, then the novel barrier structures 104, 204, 304, 404, 504, 604, and 704 described herein are preferably at least included in the metallization layers $M_0$ through $M_{t+1}$ and $V_0$ through $V_t$ having the low k or ultra low k insulating materials, for additional structural support for the weaker dielectric materials. The barrier structures 104, 204, 304, 404, 504, 604, and 704 may not be formed (although in some embodiments, they may be) in more conventional silicon dioxide-based insulating material layers of the semiconductor devices 100, 200, 300, 400, 500, 600, or 700, for example. However, in other embodiments, a continuous barrier structure 104, 204, 304, 404, 504, 604, and 704 is formed at the edge of the die to create a continuous metal wall at the chip edges, for example.

The barrier structures 104, 204, 304, 404, 504, 604, and 704 described herein prevent cracks and/or delaminations that may be caused by the chip dicing process or due to packaging stress, for example. Embodiments of the present invention are particularly advantageous when used in semiconductor devices 100, 200, 300, 400, 500, 600, and 700 having insulating material layers 752 comprising low-k and ultra-low-k materials that may have very weak mechanical properties, for example.

Embodiments of the present invention wherein the barrier structures 104, 204, 304, 404, 504, 604, and 704 are thicker and have a greater width, e.g., in a lateral dimension across a surface of a workpiece in conductive line layers $M_0$, $M_1$, $M_2$ ... $M_{t+1}$ than in via layers $V_1$, $V_2$ ... $V_t$, e.g., wherein the portions of the barrier structures 104, 204, 304, 404, 504, 604, and 704 within the conductive line layers $M_0$, $M_1$, $M_2$ ... $M_{t+1}$ are substantially V-shaped or comprise plate-like structures or shapes, further assist in crack prevention in semiconductor devices 100, 200, 300, 400, 500, 600, and 700 by retaining any cracks that may form within via layers $V_1$, $V_2$ ... $V_t$ between the conductive line layers $M_0$, $M_1$, $M_2$ ... $M_{t+1}$, for example.

Although embodiments of the present invention and their advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of manufacturing a semiconductor device, the method comprising:
   manufacturing a plurality of integrated circuits on a semiconductor wafer; and
   forming a barrier structure on the plurality of integrated circuits, the barrier structure comprising a plurality of substantially V-shaped regions, the plurality of substantially V-shaped regions being oriented parallel to a horizontal plane, each of the plurality of substantially V-shaped regions being disposed adjacent another of the plurality of substantially V-shaped regions, wherein the barrier structure comprises a first continuous line of the plurality of substantially V-shaped regions and a second continuous line of the plurality of substantially V-shaped regions proximate the first continuous line of the plurality of substantially V-shaped regions, wherein the first continuous lines have a first height along a vertical direction, wherein the second continuous lines have a second height along the vertical direction, and wherein the first and the second continuous lines are laterally separated in a top view of the semiconductor device.

2. The method according to claim 1, wherein forming the barrier structure comprises forming a barrier structure wherein the plurality of substantially V-shaped regions comprises substantially a same size or shape.

3. The method according to claim 1, wherein forming the barrier structure comprises forming a barrier structure wherein at least two of the plurality of substantially V-shaped regions comprises different sizes or shapes.

4. The method according to claim 1, wherein forming the barrier structure comprises forming a barrier structure wherein at least one of the plurality of substantially V-shaped regions is symmetric or asymmetric about a central axis.

5. The method according to claim 1, further comprising separating the plurality of integrated circuits from one another proximate the barrier structure of each integrated circuit, wherein the barrier structure prevents cracks from forming in the plurality of integrated circuits during a separation process for separating the plurality of integrated circuits from one another, during a subsequent packaging process of the plurality of integrated circuits, or during handling of the plurality of integrated circuits.

6. The method according to claim 1, wherein forming the barrier structure comprises a single damascene process, a dual damascene process, a multiple damascene process, a subtractive etch process, or combinations thereof.

7. The method according to claim 1, wherein forming the barrier structure comprises forming the barrier structure during fabrication of other material layers of the plurality of integrated circuits, or after fabrication of other material layers of the plurality of integrated circuits.

8. The method according to claim 1, wherein the plurality of substantially V-shaped regions comprises a V shape comprising two substantially straight lines that intersect at a pointed area.

9. The method according to claim 1, wherein the plurality of substantially V-shaped regions comprises a substantially V shape comprising two stair-step-shaped elements that intersect at a substantially pointed area.

10. The method according to claim 9, further comprising at least one protruding element within an open area of at least one of the plurality of substantially V-shaped regions, wherein the at least one protruding element is coupled to and extends from one of the stair-step-shaped elements.

11. The method according to claim 9, further comprising a connecting member disposed between at least one of the plurality of substantially V-shaped regions and an adjacent substantially V-shaped region.

12. The method according to claim 1, wherein at least one of the plurality of integrated circuits comprises at least one metallization layer, wherein the plurality of substantially V-shaped regions of the barrier structure is formed in the at least one metallization layer of the integrated circuits.

13. The method according to claim 12, wherein the at least one metallization layer comprises at least one conductive line layer and at least one via layer, wherein the barrier structure includes a plurality of first substantially V-shaped regions disposed in the at least one via layer, and wherein the barrier structure includes a second substantially V-shaped region disposed in the at least one conductive line layer, the second substantially V-shaped region being larger than the plurality of first substantially V-shaped regions, or wherein the barrier structure includes a plate-like structure disposed in the at least one conductive line layer.

14. The method according to claim 12, wherein at least one of the plurality of integrated circuits is formed on a workpiece, the workpiece having a top portion, and wherein a portion of the barrier structure is also formed in the top portion of the workpiece.

15. The method according to claim 1, the semiconductor device disposed on a wafer, wherein the plurality of semiconductor devices comprises the integrated circuit separated from other integrated circuits by a scribe line region, wherein the barrier structures of the integrated circuits are disposed proximate the scribe line region of the wafer.

16. The method according to claim 1, wherein at least one of the plurality of substantially V-shaped regions intersects with another of the plurality of substantially V-shaped regions thereby forming a smaller V-shaped region in an intersected region.

17. A method of manufacturing a semiconductor device, the method comprising:
fabricating a plurality of integrated circuits on a semiconductor wafer; and
forming a first W-shaped region disposed within a barrier structure around an integrated circuit, the first W-shaped region comprising
a first substantially V-shaped region having a first side and a second side, and
a second substantially V-shaped region having a first side and a second side, the second substantially V-shaped region disposed adjacent the first substantially V-shaped region, wherein the second side of the first substantially V-shaped region intersects with the first side of the second substantially V-shaped region at an intersection point, and wherein the intersection point is at about a center of the second side of the first substantially V-shaped region.

18. The semiconductor device of claim 17, wherein the intersection point is at about a center of the first side of the second substantially V-shaped region.

19. The semiconductor device of claim 17, further comprising a third substantially V-shaped region having a first side and a second side, the third substantially V-shaped region disposed adjacent the first substantially V-shaped region, an end of the second side of the third substantially V-shaped region intersecting an end of the first side of the first substantially V-shaped region.

20. The semiconductor device of claim 17, wherein the first W-shaped region is part of a first continuous line, the first continuous line being formed continuously around the integrated circuit.

* * * * *